(12) United States Patent
Tan et al.

(10) Patent No.: US 11,767,592 B2
(45) Date of Patent: Sep. 26, 2023

(54) GAS-DISPERSING APPARATUS FOR MULTIPLE CHEMICAL RESOURCES

(71) Applicant: PIOTECH INC., Shenyang (CN)

(72) Inventors: Huaqiang Tan, Shenyang (CN); Gi-Youl Kim, Shenyang (CN); Zhuo Wang, Shenyang (CN); Xin Su, Shenyang (CN)

(73) Assignee: PIOTECH INC., Shenyang (CN)

( * ) Notice: Subject to any disclaimer, the term of this patent is extended or adjusted under 35 U.S.C. 154(b) by 0 days.

(21) Appl. No.: 17/110,516

(22) Filed: Dec. 3, 2020

(65) Prior Publication Data

US 2021/0172063 A1 Jun. 10, 2021

(30) Foreign Application Priority Data

Dec. 4, 2019 (CN) .......................... 201911226704.X

(51) Int. Cl.
*H01J 37/32* (2006.01)
*C23C 16/455* (2006.01)

(52) U.S. Cl.
CPC .. *C23C 16/45565* (2013.01); *C23C 16/45574* (2013.01); *H01J 37/3244* (2013.01); *H01J 37/32431* (2013.01); *H01J 37/32449* (2013.01)

(58) Field of Classification Search
CPC ........ C23C 16/45565; C23C 16/45574; C23C 16/45512; H01J 37/32431; H01J 37/3244; H01J 37/32449
USPC .......................... 118/715; 156/345.33, 345.34
See application file for complete search history.

(56) References Cited

U.S. PATENT DOCUMENTS

| 5,950,925 A * | 9/1999 | Fukunaga | C23C 16/45574 239/428 |
| 6,302,965 B1 * | 10/2001 | Umotoy | C23C 16/16 118/715 |
| 7,252,716 B2 * | 8/2007 | Kim | C23C 16/4558 118/715 |
| 9,175,394 B2 * | 11/2015 | Yudovsky | C23C 16/45574 |
| 10,407,771 B2 * | 9/2019 | Cui | C23C 16/4558 |
| 10,487,399 B2 * | 11/2019 | Wu | C23C 16/45574 |
| 10,982,326 B2 * | 4/2021 | Wu | C23C 16/4404 |
| 2011/0223334 A1 * | 9/2011 | Yudovsky | C23C 16/4408 427/255.23 |
| 2015/0376784 A1 * | 12/2015 | Wu | C23C 16/45508 427/255.28 |
| 2016/0097119 A1 * | 4/2016 | Cui | C23C 16/45563 134/1.1 |
| 2020/0087784 A1 * | 3/2020 | Wu | C23C 16/45574 |

* cited by examiner

*Primary Examiner* — Rudy Zervigon
(74) *Attorney, Agent, or Firm* — Locke Lord LLP; Tim Tingkang Xia, Esq.

(57) ABSTRACT

The invention discloses a gas dispensing apparatus for multiple chemical resources, including: a showerhead assembly having at least two layers of board bodies and a gas mixing chamber defined at a center of the at least two layers of board bodies, and the gas mixing chamber having multiple holes defined thereon; and a pipeline assembly mounted to the showerhead assembly and having a stepped body defining at least two pipelines, the stepped body being configured to connect to the at least two layers of the board bodies to define at least two gas cavities, each of the gas cavities communicating with the corresponding one of the pipelines, each of the gas cavities communicating with the holes defined on the gas mixing chamber.

5 Claims, 3 Drawing Sheets

GAS-DISPERSING APPARATUS FOR MULTIPLE CHEMICAL RESOURCES

FIELD OF THE INVENTION

The present invention relates to a gas dispensing apparatus, particularly to a gas dispensing apparatus for multiple chemical resources.

DESCRIPTION OF THE PRIOR ART

In semiconductor manufacturing, it is possible that a usage of many kinds of chemical resources can be involved. For example, multiple chemical resources are necessary for manufacturing a multi-layered thin film. In some manufacturing processes, the chemical resources of different kinds should be avoid from contacting with each other to cause contamination such that a desired semiconductor thin film can be obtained. Thus, there is a necessity to develop a gas dispensing apparatus that can be used for multiple kinds of chemical resources without crossing the chemical resources to cause contamination.

A patent publication (No. CN103649369B) disclosed a gas inlet member of a CVD reactor, whose structure is designed to have an additional interval space between walls of a gas inlet housing and gas exhaust panels, which causes a large space occupation. Moreover, it has a complex structural design. If more chemical resources are demanded for delivery, the reactor interior has to be reconsidered and modified correspondingly.

The conventional gas dispensing apparatus has a complexity in structural design, which leads to a relative high cost in manufacturing and processing. When it comes to replacement or repairing, the apparatus needs to be unloaded entirely, which is a complicated maintaining process and spends a relative high cost. Therefore, in order to obtain a better quality of semiconductor thin film with lower manufacturing cost and higher product competitiveness, there is a demand to develop a gas dispensing apparatus with a simple structural design and adapted for multiple chemical resources.

SUMMARY OF THE INVENTION

One objective of the present invention is to provide a gas dispensing apparatus for a reaction process that uses multiple kinds of chemical resources, by which the chemical resources will not contact with each other that causes contamination.

Another objective of the present invention is to provide a gas dispensing apparatus for multiple chemical resources with simple structure and small volume.

A further objective of the present invention is to provide a chemical gas dispensing apparatus that injects gases of chemical resources into a chamber with a uniform gas pressure and flow.

To achieve the foregoing objectives, the gas dispensing apparatus for multiple chemical resources includes: a showerhead assembly having at least two layers of board bodies and a gas mixing chamber defined at a center of the at least two layers of board bodies, and the gas mixing chamber having multiple holes defined thereon; and a pipeline assembly mounted to the showerhead assembly and having a stepped body defining at least two pipelines, the stepped body being configured to connect to the at least two layers of the board bodies to define at least two gas cavities, each of the gas cavities communicating with the corresponding one of the pipelines, each of the gas cavities communicating with the holes defined on the gas mixing chamber.

Preferably, the gas dispensing apparatus further includes a plate connected to a bottom of the showerhead assembly and the pipeline assembly by a threading component and the plate having multiple holes defined thereon.

Preferably, the gas mixing chamber further defines a top opening and a bottom opening, the stepped body has a gas passage defined at a center thereof, the gas passage communicates with the top opening and the bottom opening.

Preferably, the gas passage is configured to inject an inert gas into the gas mixing chamber, and the inert gas flows toward the holes of the plate via the bottom opening of the gas mixing chamber.

Preferably, the holes defined on the gas mixing chamber are arranged on a periphery of the gas mixing chamber, and close to the at least two layers of the board bodies.

Preferably, the holes are a straight hole, inclined hole, semi-circular hole, triangle hole, pentagonal hole, hexagon hole or oval hole.

Preferably, the layers of the board bodies has at least two board bodies, the at least two layers of board bodies have different diameters.

Preferably, an upper layer of the at least two layers of the board bodies has a diameter less than that of a lower layer of the at least two layers of the board bodies.

Preferably, the diameters of the at least two board bodies decrease from the lower layer to the upper layer.

Preferably, outer diameters of the gas cavities decrease from the lower layer to the upper layer.

The gas dispensing apparatus according to the present invention utilizes its internal multiple independent spaces to divide and supply the fluid chemicals, and therefore avoids the multiple chemical resources from contacting with each other and contamination.

DETAILED DESCRIPTION OF THE PREFERRED EMBODIMENTS

The following description provides embodiments in accordance with the present invention to exemplify advantages and technical features of the present invention. Nevertheless, the described embodiments is not meant to limit the invention, any person familiar with the art may be able to make various change and modification to the illustrated embodiments without departure from the spirit and scope thereof. Accordingly, the protection coverage of the invention can be defined by the accompanied claims as set forth.

Figure 1:
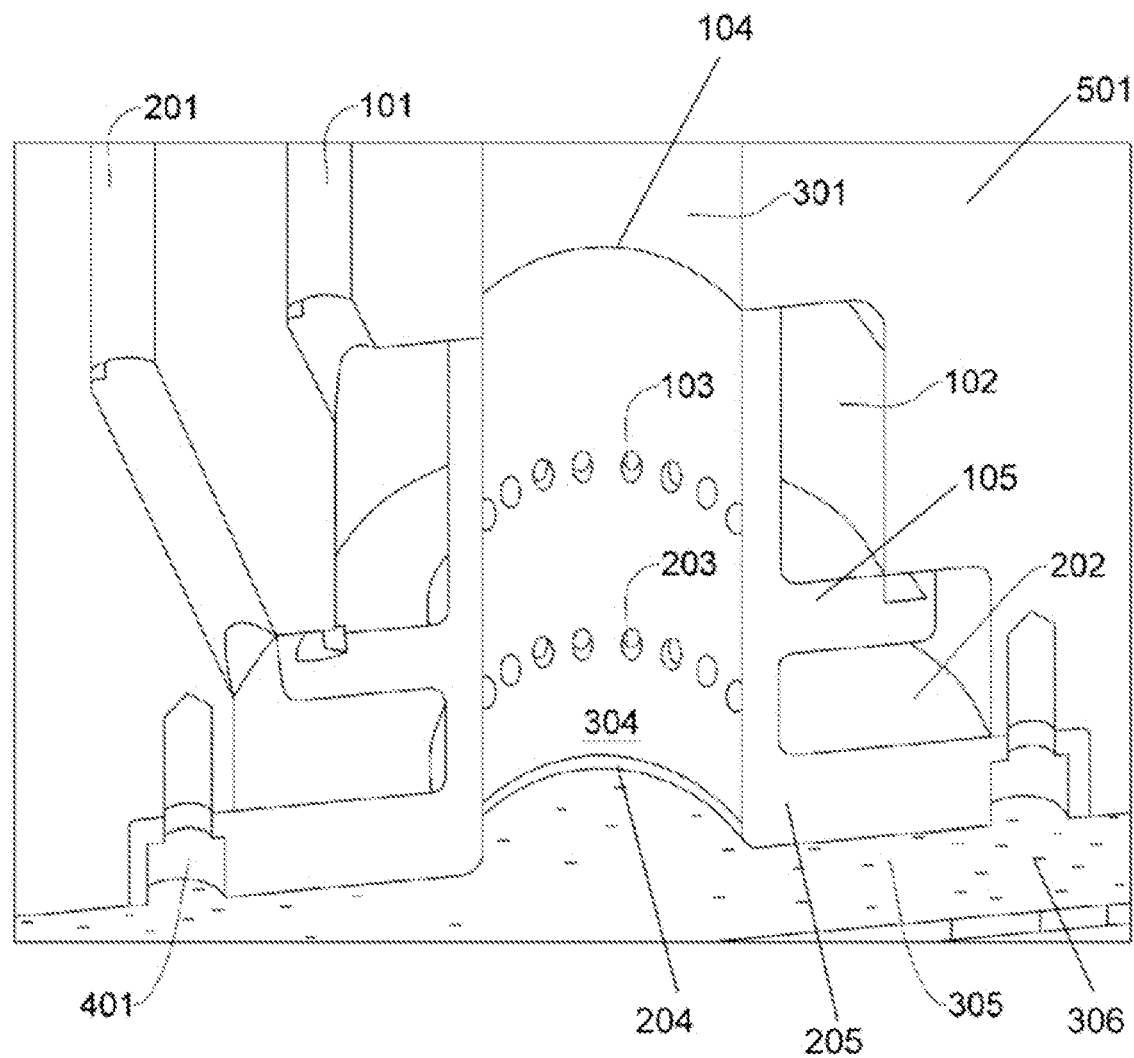
FIG. 1 is a cross-sectional view illustrating a gas dispensing apparatus for multiple chemical resources according to the present invention.

Referring to FIG. 1, which illustrates a gas dispensing apparatus for multiple chemical resources in accordance with the present invention. As shown in FIG. 1, the gas dispensing apparatus for multiple chemical resources in accordance with the present invention includes a showerhead assembly which has at least two layers of board bodies and a gas mixing chamber (304) defined at a center of the at least two layers of board bodies. A wall defining the gas mixing chamber (304) has multiple holes (103 and 203) formed thereon. A pipeline assembly is mounted on the showerhead assembly and has a stepped body with at least two gas pipelines (101 and 201). The stepped body (501) engages with the at least two layers of board bodies to define at least two gas cavities (102 and 202), each of the gas cavities and each of the pipelines are respectively in flow communication, each of the gas cavities and the gas mixing chamber (304) are in flow communication via the holes (103 and 203).

The gas dispensing apparatus for multiple chemical resources according to the present invention further includes a plate (305) that is held below the showerhead assembly and the pipeline assembly by a threading component (401). The plate (305) has a plurality of holes (306).

The gas mixing chamber (304) provided in the gas dispensing apparatus for multiple chemical resources according to the present invention further has a top opening (104) and a bottom opening (204) defined therethrough, and a gas passage (301) is defined through a center of the stepped body (501). The gas passage (301) communicates with the top opening (104) and is configured to import an inert gas (not shown) into the gas mixing chamber (304), and the inert gas passes through the bottom opening (204) toward to the holes (306) of the plate (305).

The layered board bodies provided in the gas dispensing apparatus for multiple chemical resources have at least two board bodies. In the embodiment, only a first board body (105) and a second board body (205) are shown for brief explanation. A diameter of the first board body (105) is different from a diameter of the second board body (205). As can be seen, the diameter of the first board body (105) is less than that of the second board body (205). That is, in the case where the layered board bodies has more than two board bodies, the diameter of the board body decreases from the lowest board body to the upper board body so that the gas dispensing apparatus for multiple chemical resources according to the invention becomes a pagoda-like structure.

In this embodiment, similar with the foregoing purpose of simple explanation, to explain the gas cavities defined between the stepped body (501), the first board body (105) and the second board body (205), only the first gas cavity (102) and the second gas cavity (202) are shown, and only a first gas pipeline (101) and a second gas pipeline (201) communicated with the first gas cavity (102) and the second gas cavity (202) are shown.

Figure 2:
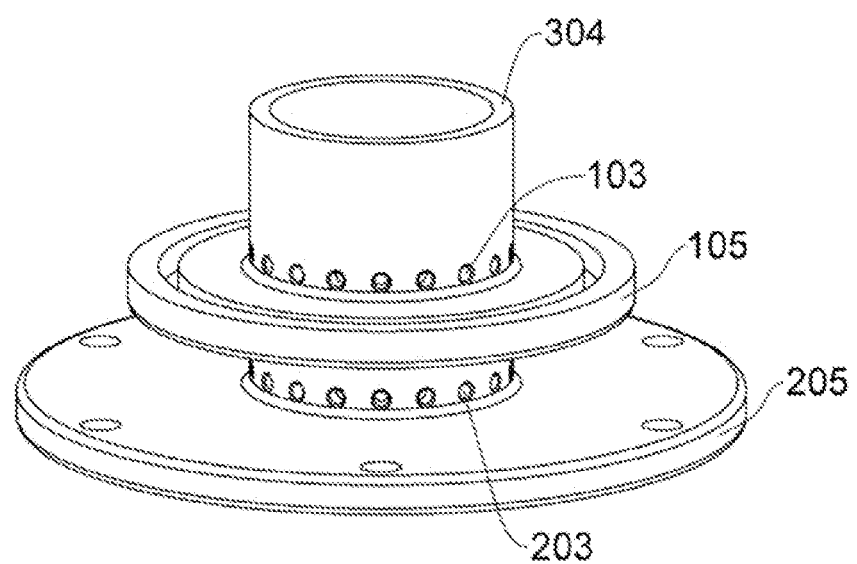
FIG. 2 is a perspective view illustrating the gas dispensing apparatus for multiple chemical resources according to the present invention, with a gas mixing chamber, a first board body and a second board body.

Referring to FIG. 1 together with FIG. 2 which shows a perspective view of the first board body and the second board body of the gas dispensing apparatus for multiple chemical resources according to the invention. In this embodiment, a plurality of holes of the gas mixing chamber (304) includes a plurality of first holes (103) and second holes (203) respectively corresponding to the first gas cavity (102) and the second gas cavity (202). The first holes (103) communicate with the first gas cavity (102) while the second holes (203) communicate with the second cavity (202). In this embodiment, the first gas cavity (102) and the second gas cavity (202) respectively have 18 first holes (103) and 18 second holes (203) which uniformly arranged on a periphery of the gas mixing chamber (304). Position of the first holes (103) and position of the second holes (203) are respectively close to the first board body (105) and the second board body (205), as shown in FIG. 2, which can produces a uniform gas density above a wafer.

In addition, the first hole (103) and the second hole (203) of the embodiment are both straight holes. An axis of each one of the first hole (103) and the second hole (203) points at a center axis of the gas mixing chamber (304) (i.e. at the center axial of the respective heating plate, the showerhead assembly and the wafer) since the first hole (103) and the second hole (203) are uniformly arranged at and encircling a periphery of the gas mixing chamber.

Figure 3:
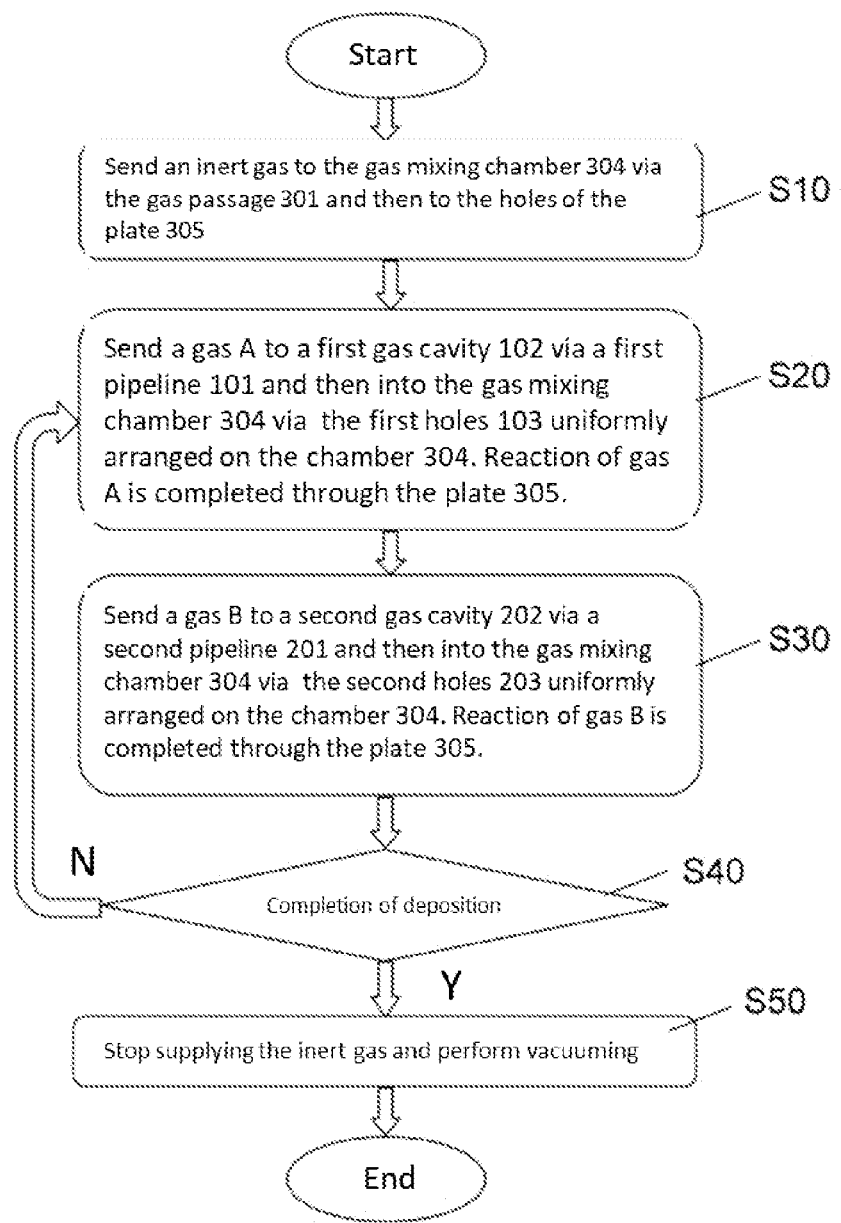
FIG. 3 is a flow chart illustrating a process for the gas dispensing apparatus for multiple chemical resources according to the present invention.

Referring to FIG. 3 with both FIGS. 1 and 2, FIG. 3 illustrates a flow chart for the gas dispensing apparatus for multiple chemical resources according to the invention. To form a deposition thin film, step S10 is first performed, in which an inert gas is delivered to the gas mixing chamber (304) through the gas passage (301) and then flows to the holes (306) defined on the plate (305). Thereafter, step S20 is performed, in which a gas (A) is sent to the first gas cavity (102) via the first gas pipeline (101) and flows into the gas mixing chamber (304) via first holes (103) uniformly arranged and defined on the wall defining the mixing chamber (304). A reaction of the gas (A) is completed through the plate (305). Then, step S30 is performed, a gas (B) is sent to the second gas cavity (202) via the second pipeline (201) and flows into the gas mixing chamber (304) via second holes (203) uniformly arranged and defined on the wall defining the mixing chamber (304). A reaction of the gas (B) is completed through the plate (305). Furthermore, step S40 is performed to determine whether the deposition thin film is completed. If it is determined that the deposition is not completed, the step returns to step S20 to continue the gas reaction of the gas (A) and the gas (B). Step S50 is performed until the deposition is completed, in which the inert gas delivery is stopped and a vacuuming process is carried out to finish the thin film deposition. It is worth noted that the inert gas is continuously supplied through the inert gas passage (301) in the thin film deposition manufacturing in order to avoid the gas (A) and the gas (B) from flowing backward.

In addition, as particularly pointed out herein, the gas dispensing apparatus may have a variety of configurations for the showerhead assembly depending on the number and kinds of the chemical resources and a configuration for the pipeline cooperating with the showerhead assembly may change as well. For example, if there are three kinds of chemical resources to be used, the layered board bodies of the showerhead assembly have three layers of board bodies, the stepped body (501) and the three layers of board bodies define three gas cavities when stepped body (501) of the pipeline assembly is mounted to the three layers of board bodies. Each gas cavity communicates with each respective pipeline. That is, the three pipelines respectively communicates with each one of the gas cavities, and each one of the gas cavities communicates with each one of holes defined on the gas mixing chamber (304). And so on, with more chemical resources applied in the gas dispensing apparatus according to the invention, the configuration of the showerhead assembly and the pipeline assembly will be modified correspondingly so that each inlet pipeline is independent and dedicated for each one of the chemical resources that will not interact with each other and cause contamination. Plus, the structure is more simple than that of the conventional manner which utilizes a number of layers (horizons) and zones (longitudes) to separate different chemical resources.

In the embodiment, the gas dispensing apparatus for multiple gas resources according to the invention forms plural independent gas inlet paths by structural cooperation between a showerhead assembly and a pipeline assembly, which allows the gases from respective chemical resources will not contact with each other during a reaction, and therefore contamination can be avoided. Also in the embodiment, the showerhead assembly and the pipeline assembly are structured to be unloaded so that the showerhead assembly can be departed from the pipeline assembly and to be cleaned respectively during maintenance and cleanness.

In the embodiment, the first gas cavity (102) and the second gas cavity (202) send the gases to the gas mixing chamber (304) via the first holes (103) and the second holes (203) uniformly defined on the gas mixing chamber. Therefore, this can effectively improve the pressure and flow uniformity when the gas is injected through the gas passage to the gas mixing chamber, improving the gas supply uniformity.

The gas dispensing apparatus according to the invention is adapted for the usage within a same reaction chamber applying multiple chemical resources, particularly adapted for multiple deposition thin films, such as multiple layers of $SiO_2$-$Si_3N_4$ (ONON) stack. The number of the board bodies of the showerhead assembly and the gas cavities of the pipeline assembly of the gas dispensing apparatus according to the invention can be increased depending on the demand for how many chemical resources are used. In addition, the numbers, shapes, axial direction and arrangement of the holes can be modified depending on a variety of manufacturing processes. The hole shape is not limited to the straight hole, for example, inclined hole, semi-circular hole, the triangle hole, square hole, pentagonal hole, hexagon hole and oval hole can be possible. The present provides a flexibility to make adjustment to adapt the manufacturing requirement, resulting in a subsequent replacing possibility or simple maintenance as well as low cost.

Other embodiments. Features disclosed in the invention specification can be combined with each other in any manners. Features disclosed in the invention specification can be substituted with features having identical, equivalent or similar purpose. Accordingly, the features disclosed in the invention specification are from one of a serious of equivalent or similar embodiments except for that particularly stated.

In addition, a person familiar with the art can easily make proper change and modification under different using methods and circumstances based on the basic features of the invention without departing from the scope and spirit of the invention. Hence, other embodiments are also included within the claims.

What is claimed is:

1. A gas dispensing apparatus for multiple chemical resources, comprising:
   a gas mixing chamber with a first board body and a second board body separated with each other and outwardly extending from the gas mixing chamber, wherein the gas mixing chamber having multiple holes defined therethrough, and the first board body has a diameter less than that of the second board body; and
   a stepped body configured to receive the gas mixing chamber, such that when a first inner horizontal surface of the stepped body touches against the first board body and a second inner horizontal surface of the stepped body touches against the second board body, two separated gas cavities of different diameters are formed between the stepped body and the gas mixing chamber, and the two gas cavities are in flow communication with the gas mixing chamber via the holes.

2. The gas dispensing apparatus as claimed in claim 1, wherein the gas mixing chamber further defines a top opening and a bottom opening, a gas passage is defined through the stepped body, the gas passage communicates with the top opening and the bottom opening.

3. The gas dispensing apparatus as claimed in claim 2, wherein the gas passage is configured to inject an inert gas into the gas mixing chamber, and the inert gas flows via the bottom opening of the gas mixing chamber.

4. The gas dispensing apparatus as claimed in claim 1, wherein the holes defined on the gas mixing chamber are arranged on a periphery of the gas mixing chamber, and close to the first board body and the second board body.

5. The gas dispensing apparatus as claimed in claim 4, wherein the holes are a straight hole, inclined hole, semi-circular hole, triangle hole, pentagonal hole, hexagon hole or oval hole.

\* \* \* \* \*